United States Patent
Yano et al.

(10) Patent No.: US 8,693,249 B2
(45) Date of Patent: Apr. 8, 2014

(54) SEMICONDUCTOR MEMORY DEVICES

(75) Inventors: Masaru Yano, Tokyo (JP); Lu-Ping Chiang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 138 days.

(21) Appl. No.: 13/350,338

(22) Filed: Jan. 13, 2012

(65) Prior Publication Data

US 2013/0016560 A1    Jan. 17, 2013

(30) Foreign Application Priority Data

Jul. 13, 2011   (JP) ................. 2011-154453

(51) Int. Cl.
*G11C 16/04* (2006.01)
(52) U.S. Cl.
USPC ............................... 365/185.11; 365/185.25
(58) Field of Classification Search
USPC ........................ 365/185.11, 185.18, 185.25
See application file for complete search history.

(56) References Cited

U.S. PATENT DOCUMENTS

| 2002/0191443 | A1 | 12/2002 | Lee et al. | |
| 2007/0195609 | A1 | 8/2007 | Kim et al. | |
| 2010/0208526 | A1* | 8/2010 | Kim et al. | 365/185.29 |
| 2013/0272047 | A1* | 10/2013 | Yi et al. | 365/63 |

FOREIGN PATENT DOCUMENTS

| JP | 2006302960 A | 11/2006 |
| KR | 10-2002-0095876 | 12/2002 |
| KR | 10-0771517 | 10/2007 |

OTHER PUBLICATIONS

Fukuda et al., "A 151mm2 64GB MLC NAND Memory in 24nm CMOS Technology", IEEE International Solid-State Circuits Conference, (Feb. 22, 2011) pp. 198-199.

* cited by examiner

*Primary Examiner* — Huan Hoang
(74) *Attorney, Agent, or Firm* — Muncy, Geissler, Olds & Lowe, P.C.

(57) ABSTRACT

A semiconductor memory device includes a memory array, a row selection circuit and a bit line selection circuit. The memory array is composed of a plurality of cell units, wherein each cell unit has memory cells connected in series. The row selection circuit selects the memory cells in a row direction of the cell units, and the bit line selection circuit selects a bit line from an even bit line and an odd bit line coupled to the cell units. The bit line selection circuit includes a first selection part including selection transistors for selectively coupling the even or odd bit line to a sensor circuit and a second selection part including bias transistors for selectively coupling the even or odd bit line to a voltage source providing biases, wherein the bias transistors and the memory cells are formed in a common well.

10 Claims, 9 Drawing Sheets

SEMICONDUCTOR MEMORY DEVICES

CROSS REFERENCE TO RELATED APPLICATIONS

This Application claims priority of the benefit of Japan Patent Application No. JP2011-154453, filed on Jul. 13, 2011, the entirety of which is incorporated by reference herein.

BACKGROUND OF THE INVENTION

1. Field of the Invention

The present invention relates to a semiconductor memory device, and more particularly relates to a bit line selection circuit of NAND flash memory devices.

2. Description of the Prior Art

A flash memory serves as a storage device which can be widely used in digital cameras, smart phones and other electronic devices. Demand for small size, high-capacity, fast access and low power consumption of a flash memory devices have increased.

A NAND-type flash memory is formed by a memory array configured with a plurality of NAND gate strings connected in a row direction. The NAND gate string is formed by a plurality of memory cells coupled in a row direction and selection transistors coupled to the two ends of the NAND gate string. One end of the NAND gate string is coupled to the bit line by one selection transistor, and the other end of the NAND gate string is coupled to the source line by the other selection transistor. Reading and programming of data is performed by a bit line coupled to the NAND gate string. For example, a flash memory is capable of improving the data programming speed.

FIG. 1 shows a bit line selection circuit of a conventional flash memory. The bit line selection circuit is configured with a pair of an even bit line BLe and an odd bit line BLo. The bit line selection circuit 300 includes a first selection part 310 comprising a selection transistor BLC for coupling the even bit line BLe or the odd bit line BLo to a sensor circuit and a second selection part 320 comprising bias transistors BIASe and BIASo for applying a bias VPRE to the even bit line BLe and the odd bit line BLo, and selection transistors BLSe and BLSo for coupling the even bit line BLe and the odd bit line BLo to the first selection part 310. In order to pre-charge a bias to the bit line when programming data or pre-charge an erasing voltage to a cell well when erasing data, the bias transistors BIASe and BIASo and the selection transistors BLSe and BLSo of the second selection part 320 are high voltage (HV) transistors with a thicker gate oxide film and longer gate length.

FIG. 2 shows a bit line selection circuit of K. Fukuda. Et al., in which the second selection part 320A of the bit line selection circuit 300A is formed by low voltage (LV) transistors. A relay part 330 which is formed by HV transistors is configured between the first selection part 310 and the second selection part 320A. The thickness of the gate oxide films of the transistors BIASe, BIASo, BLSe, and BLSo is a normal thickness, the gate length is shorter, and the gate oxide film is configured in the cell well. The transistor BLS of the relay part 330 is configured outside of the cell well, and is used when the LV transistors of the second selection part 320A are disconnected from the selection transistor BLC of the first selection part 310. When erasing data, the gates of the transistors of the second selection part 320A are floating, and the erasing voltage is increased by capacitance coupling between the gate and the cell well, so that the potential of the gate prevents the gate oxide films of the LV transistors from breaking down. Because the LV transistors in the second selection part 320A occupy a smaller layout area, small size of the memory is achieved.

BRIEF SUMMARY OF THE INVENTION

A semiconductor memory device includes a memory array which is composed of a plurality of cell units, wherein each cell unit is composed of electrically-erasable programmable read-only memory cells connected in series, a row selection circuit selects the memory cells in a row direction of the cell units, and a bit line selection circuit selects a bit line from an even bit line and an odd bit line coupled to the cell units, wherein the bit line selection circuit includes a first selection part including selection transistors for selectively coupling the even bit line or the odd bit line to a sensor circuit and a second selection part including bias transistors for selectively coupling the even bit line or the odd bit line to a voltage source providing biases, wherein the bias transistors and the memory cells are formed in a common well.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 3:
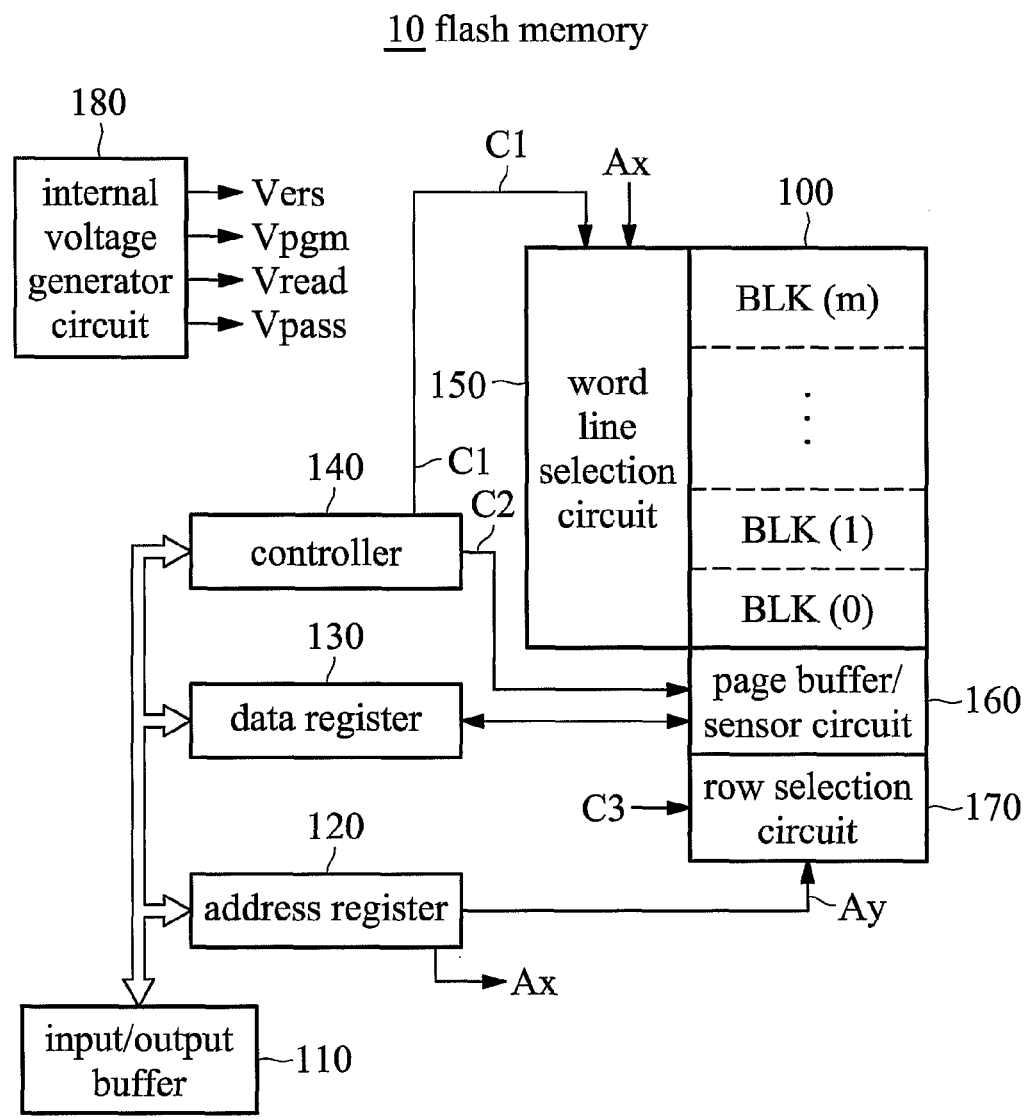
FIG. 3 is a schematic block diagram of a flash memory according to an embodiment of the invention.

FIG. 3 shows a schematic block diagram of a flash memory according to an embodiment of the invention. In this embodiment, the flash memory 10 includes a memory array 100 having a plurality of memory cells formed in a rows and columns, an input/output buffer 110 storing input/output data from the external input/output I/O terminal, an address register 120 receiving address data from the input/output buffer 110, a data register 130 storing the input/output data, a controller 140 providing control signals C1, C2 and C3 according to command data and external control signals from the input/output buffer 110, a word line selection circuit 150 selecting a block and a word line according to the decoding result of column address information Ax from the address register 120, a page buffer/sensor circuit 160 storing the data read from the page selected by the word line selection circuit 150 and the data written in the selected page, a row selection circuit 170 selecting row data stored in the page buffer according to the decoding result of row address information Ay from the address register 120, and an internal voltage generator circuit 180 generating voltages needed for reading, programming, and erasing data (i.e., programming voltage Vpgm, passing voltage Vpass, reading voltage Vread, and erasing voltage Vers).

Figure 4:
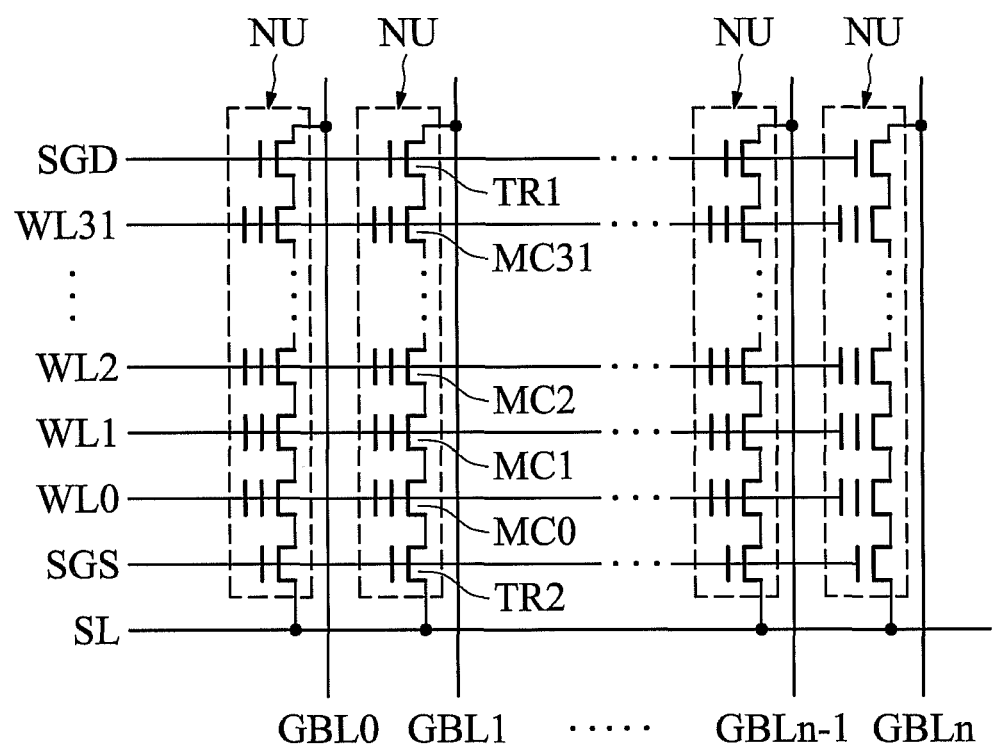
FIG. 4 is a schematic diagram of circuit of NAND gate strings.

The memory array 100 has in memory blocks (BLK(1), BLK(2), . . . , BLK(m)) in the row direction. FIG. 4 shows a circuit diagram of NAND gate strings formed in a memory block according to an embodiment of the invention. A memory block has a plurality of NAND gate strings (or a "cell unit NU"), wherein the cell units NU are arranged in the column direction and each cell unit NU includes a plurality of memory cells connected in series. The cell units NU arranged in the column direction form one memory block.

In the embodiment of FIG. 4, each cell unit NU includes 32 memory cells MCi (in the embodiment, i=0, 1, . . . , 31) connected in series and selection transistors TR1 and TR2 electrically coupled to two ends of the memory cells. The drain of the selection transistor TR1 is coupled to the bit line GBL, and the source of the election transistor TR2 is coupled to a common source line SL.

Typically, the memory cell is a MOS structure which includes the source and drain of the N type diffusion region, an oxide film formed on the channel between the source and drain, a floating gate, which is accumulated by charges, formed on the oxide film, and a control gate formed on the floating gate by a dielectric film. Generally, when no charge is accumulated on the floating gate which means data "1" is written, the threshold is negative and the memory cell is constantly ON. When the charge is accumulated on the floating gate which means data "0" is written, the threshold is positive and the memory cell is constantly OFF.

The control gate of the memory cell MCi is coupled to a corresponding word line WLi, respectively. The gates of selection transistors TR1 and TR2 are electrically coupled to the corresponding gate selection lines SGD and SGS parallel to the word lines WL, respectively. When the word line selection circuit 150 selects a memory block according to the column address Ax, the selection transistors TR1 and TR2 are turned on selectively by the gate selection lines SGD and SGS of the selected block.

The bit lines GBL0, GBL1, GBL2, . . . , GBLn coupled to the cell units NU are electrically connected to the page buffer/sensor circuit 160 via the bit line selection circuit 200. The bit line selection circuit selects an even bit line or an odd bit line when reading and programming data, and the selected even bit line or odd bit line is coupled to the page buffer/sensor circuit 160. The page buffer/sensor circuit 160 has a pair of an even bit line and an odd bit line. If the even bit line and the odd bit line form a page, respectively, the page buffer/sensor circuit 160 includes a sensor circuit for detecting the page. When the page buffer/sensor circuit 160 is reading data, the page buffer/sensor circuit 160 detects the potential of the even bit line or the odd bit line. When the page buffer/sensor circuit 160 is programming data, the page buffer/sensor circuit 160 stores data of the even bit line or the odd bit line.

Figure 5:
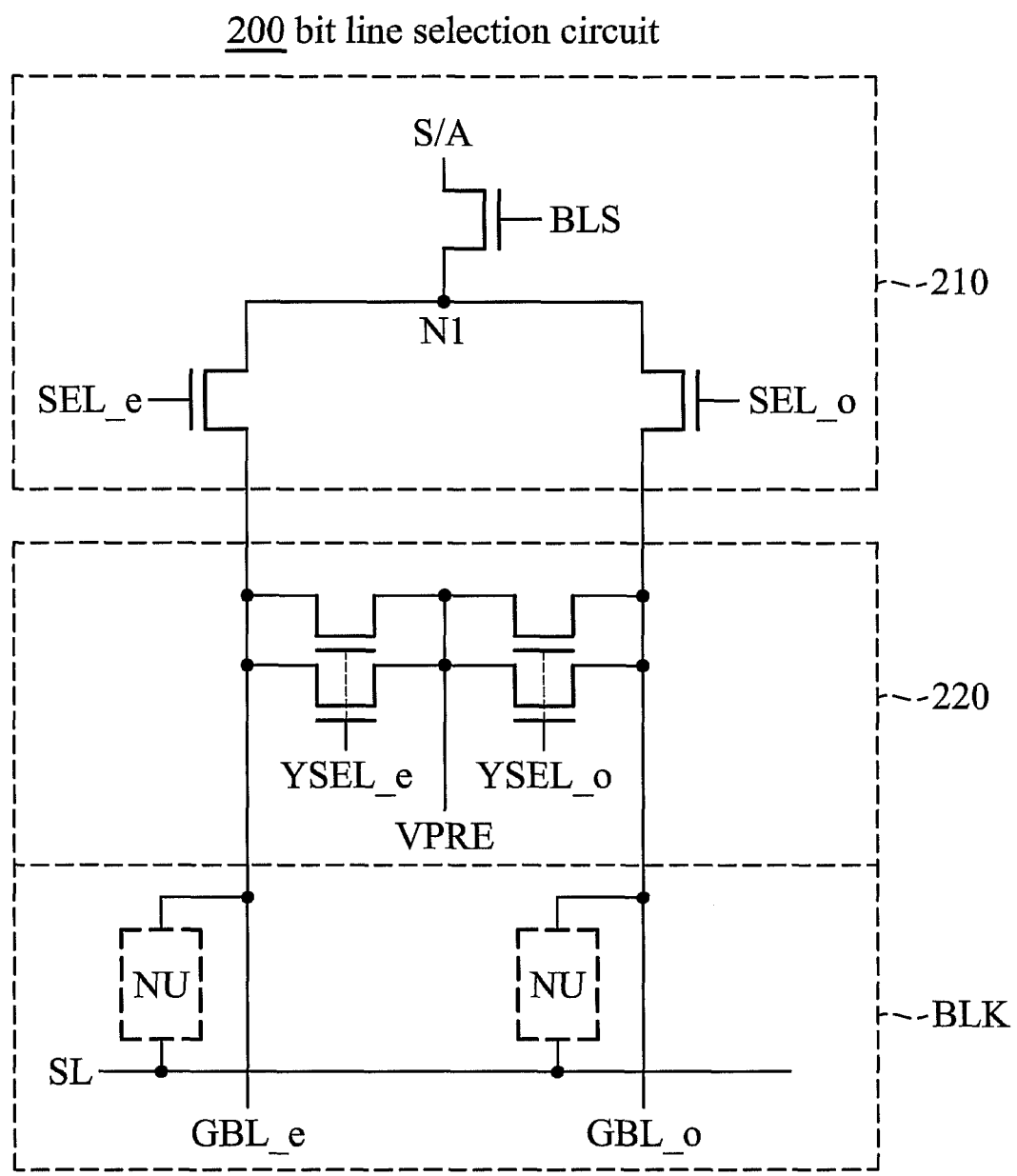
FIG. 5 is a schematic block diagram of a bit line selection circuit of an embodiment of the invention.

Further, details of the bit line selection circuit are described below according to the embodiment of the invention. FIG. 5 shows a part of the bit line selection circuit according to an embodiment of the invention. FIG. 5 shows only a pair of even bit line GBL_e and odd bit line GBL_o. In fact, it is noticed that the bit line selection circuit includes n bit line circuits for selecting bit lines GBL_0~GBL_n. Further, only one block is shown in FIG. 5.

The bit line selection circuit 200 includes a first selection part 210 for coupling the even bit line GBL_e and the odd bit line GBL_o to the page buffer/sensor circuit 160 and a second selection part 220 for applying a predetermined bias to the even bit line GBL_e and the odd bit line GBL_o.

The first selection part 210 includes an even selection transistor SEL_e coupled to the even bit line GBL_e, an odd selection transistor SEL_o coupled to the odd bit line GBL_o, and a bit line selection transistor BLS coupled between a common node N1 of the even selection transistor SEL_e and the odd selection transistor SEL_o and the sensor circuit. The transistors SEL_e, GBL_o and BLS which form the first selection part 210 are N type MOS transistors formed in the P-well of the peripheral circuit of the page buffer/sensor circuit 160. The transistors SEL_e, GBL_o and BLS which form the first selection part 210 are HV transistors capable of operating under high voltage.

The control signals from the controller 140 are applied to the gate of the even selection transistor SEL_e, the odd selection transistor SEL_o and the bit line selection transistor BLS to turn on the transistors SEL_e, SEL_o and BLS selectively when reading, programming and erasing data. For example, when reading the selected page, if the even bit line GBL_e is selected and the odd bit line GBL_o is not selected, the even selection transistor SEL_e and the bit line selection transistor BLS are ON, and the odd selection transistor SEL_o is OFF. If the odd bit line GBL_o is selected and the even bit line GBL_e is not selected, the odd selection transistor SEL_o and the bit line selection transistor BLS are ON, and the even selection transistor SEL_e is OFF. Therefore, the even bit line GBL_e and the odd bit line GBL_o or can be used by the sensor circuit commonly.

The second selection part 220 includes even bias transistors YSEL_e coupled between the even bit line GBL_e and a virtual electrode VPRE, and odd bias transistors YSEL_o coupled between the odd bit line GBL_o and the virtual electrode VPRE. The even bias transistors YSEL_e and the odd bias transistors YSEL_o are N type MOS transistors formed in the P-well of memory cells or memory blocks. The transistors which form the second selection part 220 are different from the transistors which form the first selection part 210. The transistors which form the second selection part 220 are LV transistors capable of operating under low voltage. Therefore, gate oxide films Gox of the even bias transistors YSEL_e and the odd bias transistors YSEL_o which form the second selection part 220 are the same as that of the memory cells. The even bias transistors YSEL_e, the odd bias transistors YSEL_o, and the memory cells are formed in the same way.

The control signals from the controller 140 are applied to gates of the even bias transistors YSEL_e and the odd bias transistors YSEL_o, and the transistors YSEL_e and YSEL_o are turned on selectively when reading, programming and erasing data. Also, a bias or a pre-charged voltage corresponding to the internal voltage generator circuit 180 is provided to the virtual electrode VPRE according to the control signals of the controller 140. For example, when reading a page, if the even bit line GBL_e is selected and the odd bit line GBL_o is not selected, the even bias transistor YSEL_e is OFF and the odd bias transistor YSEL_o is ON, and a shielding potential is provided to the virtual electrode VPRE. If the even bit line GBL_e is not selected and the odd bit line GBL_o is selected, the even bias transistor YSEL_e is ON and the odd bias transistor YSEL_o is OFF, and the shielding potential is provided to the even bit line GBL_e. For example, the shielding potential is a ground potential. A inhibit voltage of the programming is provided to the virtual electrode VPRE when programming data, wherein the channel of the memory cell of the non-selected bit line is biased or pre-charged with a programming inhibit voltage.

Figure 1:
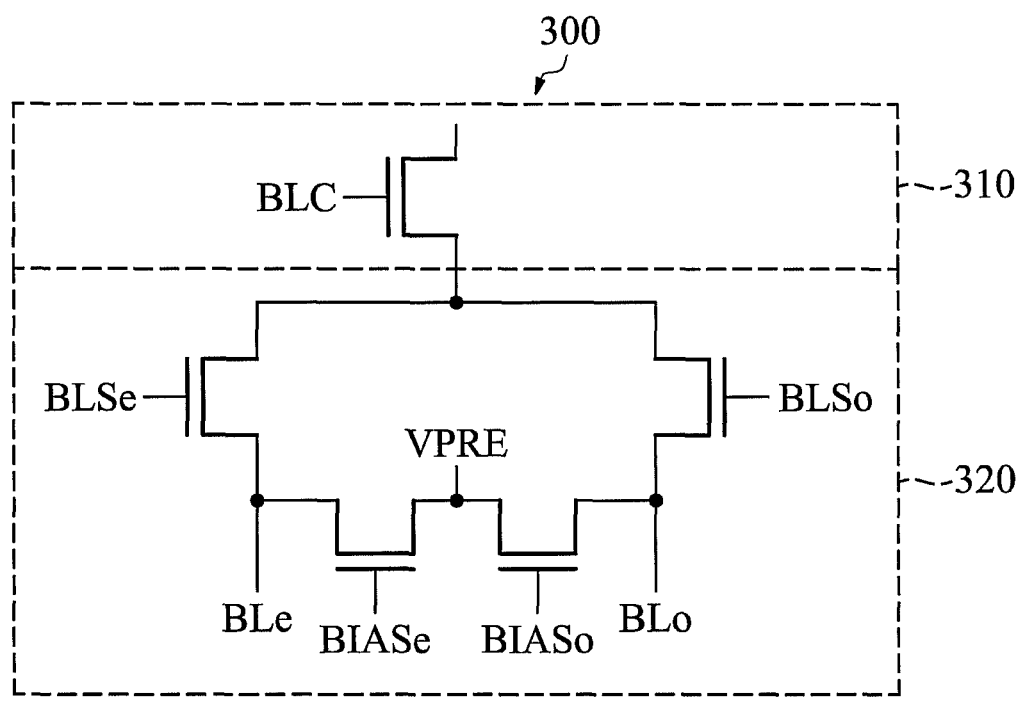
FIG. 1 is a schematic block diagram of a bit line selection circuit of a flash memory according to the prior art.

A feature of the embodiment of the invention is that the timing of the even bias transistors YSEL_e and the odd bias transistors YSEL_o formed in the memory array or the memory block are the same as the timing of the formed memory cells. Further, in comparison with the transistors which form the first selection part 210, the bias transistors are formed by LV transistors with thinner gate oxide films and longer channel lengths. Therefore, the layout area of the bit line selection circuit 200 of this embodiment is smaller than that of the bit line selection circuit 300 shown in FIG. 1.

Figure 2:
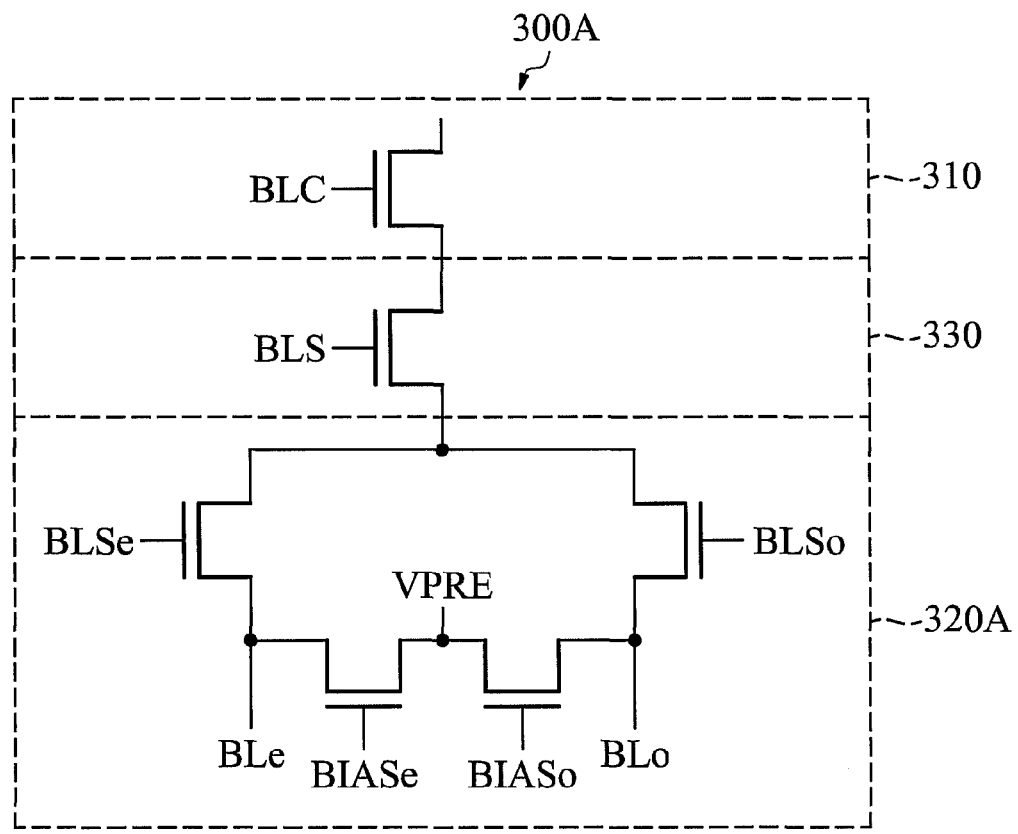
FIG. 2 is a schematic block diagram of another bit line selection circuit of a flash memory according to the prior art.

Further, because the layout area for each of the even bias transistors YSEL_e and the odd bias transistors YSEL_o is smaller, the driving ability of each bias transistor is smaller. In order to make up the defect, the even bias transistors YSEL_e and the odd bias transistors YSEL_o are coupled in parallel. In fact, the channel width of the transistors YSEL_e and YSEL_o can be increased by this way. Therefore, in comparison with the bit line selection circuit 300A shown in FIG. 2, the bit line selection circuit 200 can rapidly charge or discharge the biases on the bit line.

Figure 6:
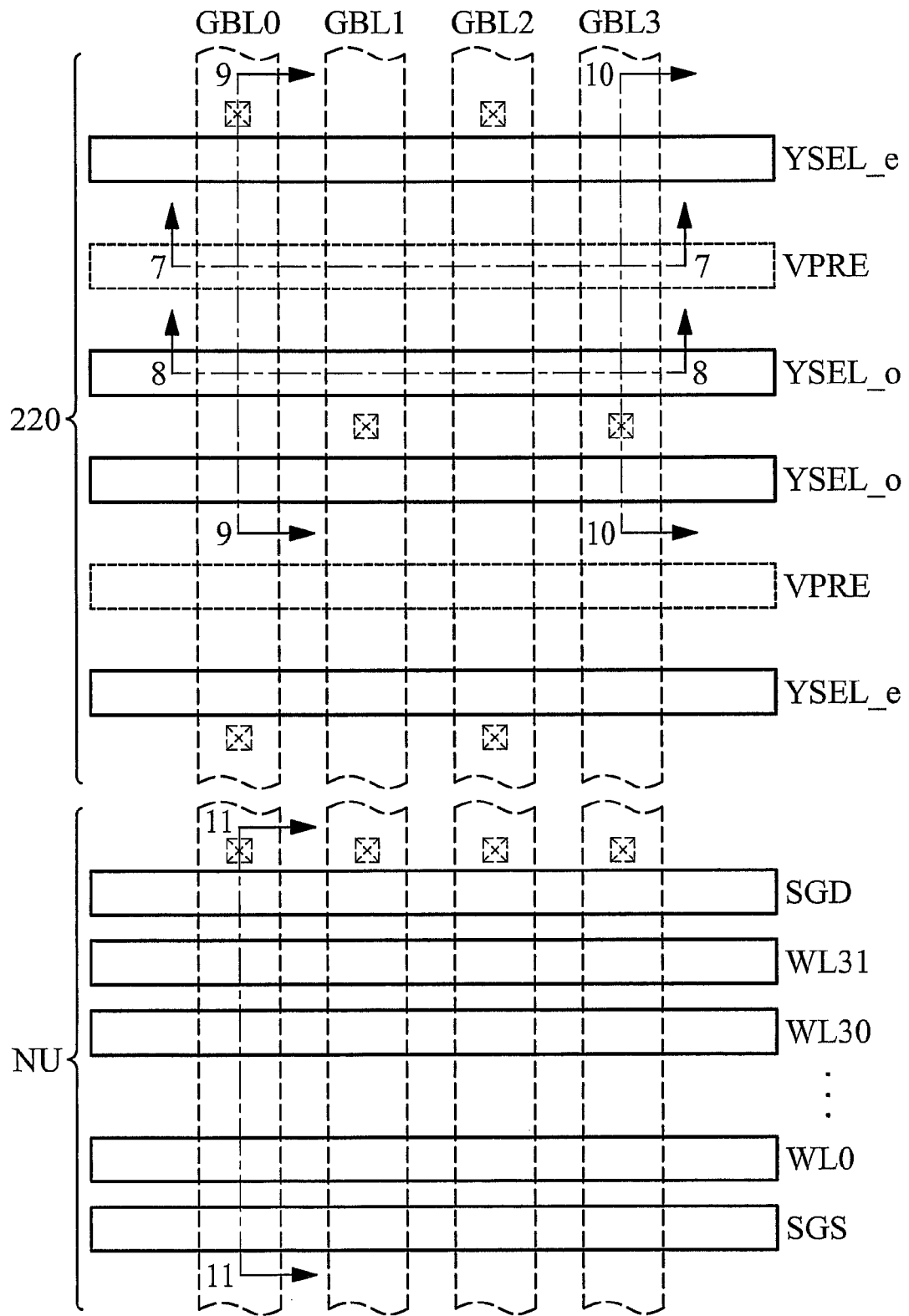
FIG. 6 is a schematic diagram of a layout of the bit line selection circuit according to an embodiment of the invention.
Figure 7:
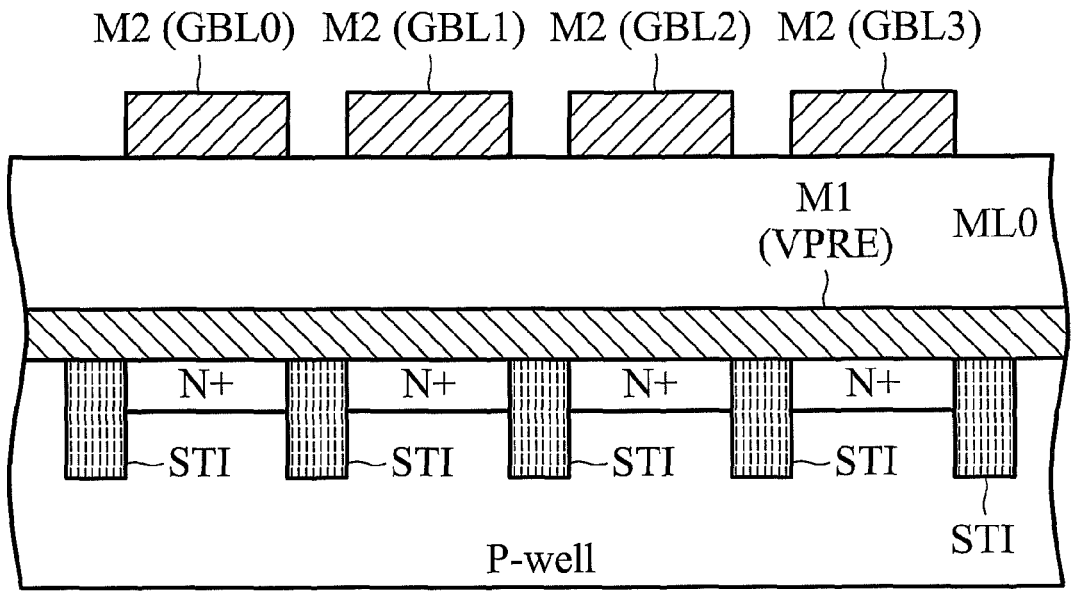
FIG. 7 is a cross section along the line 7-7 shown in FIG. 6.
Figure 8:
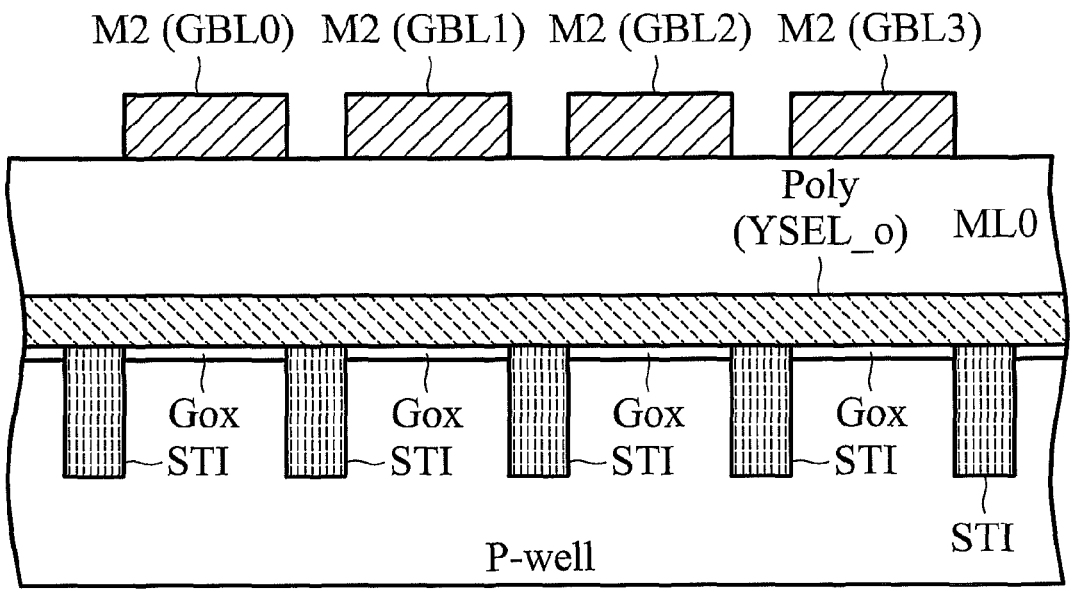
FIG. 8 is a cross section along the line 8-8 shown in FIG. 6.
Figure 9:
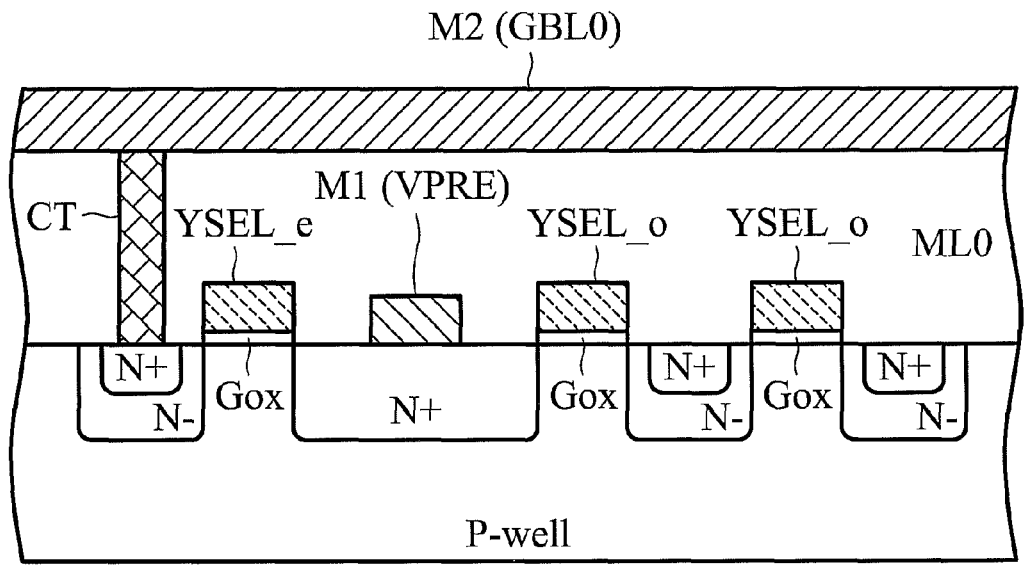
FIG. 9 is a cross section along the line 9-9 shown in FIG. 6.
Figure 10:
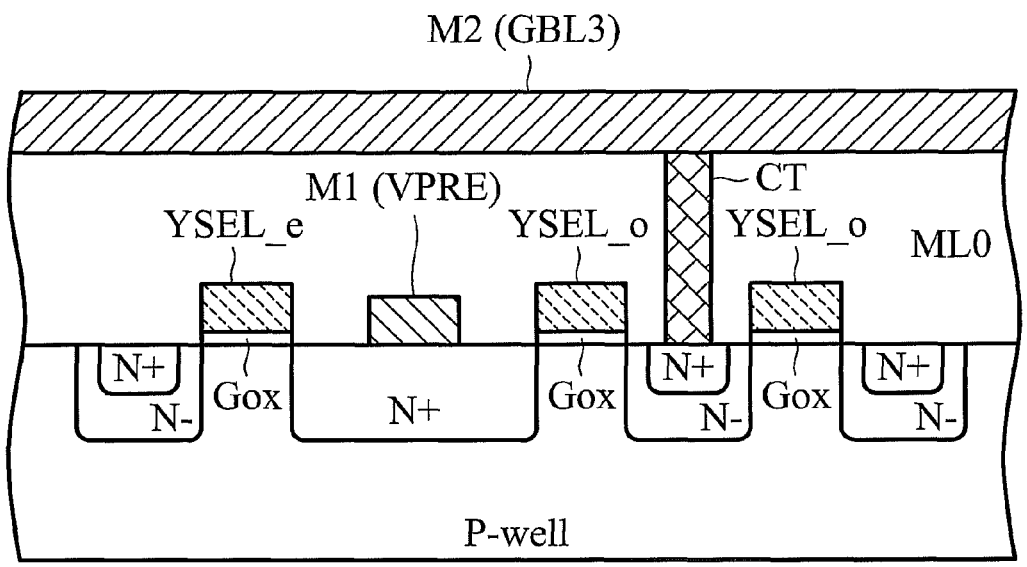
FIG. 10 is a cross section along the line 10-10 shown in FIG. 6.
Figure 11:
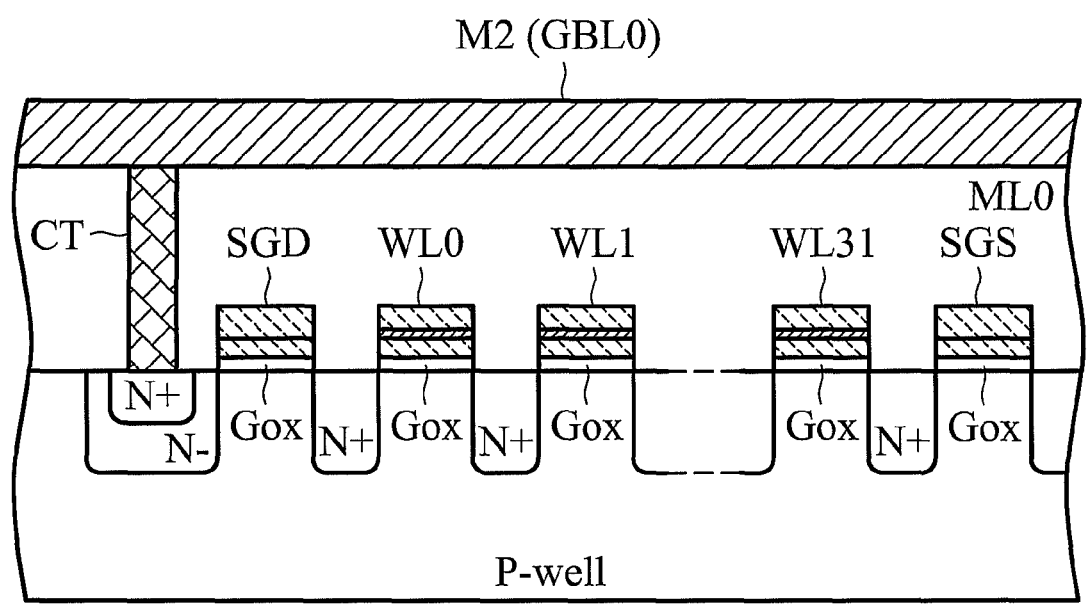
FIG. 11 is a cross section along the line 11-11 shown in FIG. 6.

Further, details of a layout of the second selection part 220 of the bit line selection circuit 200 are described below according to the embodiment of the invention. FIG. 6 shows the layout of the second selection part 220 of the memory array. FIG. 7 and FIG. 8 show cross sections along the lines 7-7 and 8-8. FIG. 9 and FIG. 10 show cross sections along the lines 9-9 and 10-10. FIG. 11 shows a cross section along the line 11-11.

In a preferred condition, the memory array 100 is formed in an N-type semiconductor substrate or a P-well formed in an N-well. In order to erase data by a block, each memory block is formed in each P-well. The transistors which form the second selection part 220 and the memory cells which form the memory block (in P-well) are formed at the same time. The second selection part 220 and a single memory block are formed adjacently. However, the second selection part 220 and memory blocks may be formed adjacently.

FIG. 6 shows a layout of the bit lines GBL0~GBL3. In the second selection part 220, in order to make the even bias transistors YSEL_e and the odd bias transistors YSEL_o to be coupled in parallel, the second selection part 220 is configured with a pair of virtual electrodes VPRE, and a pair of even bias transistors YSEL_e and a pair of odd bias transistors YSEL_o which are coupled to the virtual electrodes VPRE.

In the P-well, shallow trench isolations (STI) extend in the column direction. Therefore, isolated P-type active regions can be defined by the STIs. Gate electrodes of the even bias transistors YSEL_e and the odd bias transistors YSEL_o are formed by a polysilicon layer, and the electrodes form N diffusion regions in the active regions. The N– diffusion regions are formed in the active region using the polysilicon layer to serve as a mask. The N– diffusion regions form the sources and the drains of the even transistors and the odd transistors. Also, an N+ contact of high impurity concentration is formed in the N– diffusion regions connected to the virtual electrode VPRE.

As shown in FIG. 7, the virtual electrode VPRE is formed by a metal electrode M1 of tungsten plug or tungsten rail. The metal electrode extends in the row direction which is orthogonal to the active region. The metal electrode and the N+ contact are in an ohmic contact.

The bit lines GBL0~GBL3 are formed in the direction which is orthogonal to the virtual electrode VPRE and above the virtual electrode VPRE across an insulating film MLO. The extension direction of the bit lines GBL0~GBL3 is the direction of the arrangement of the memory blocks 1, 2, . . . , and m. The spacing between bit lines GBL0~GBL3 is about the same as the spacing between active regions, and the bit lines are formed by a metal electrode M2 of aluminum or aluminum alloy. As shown in FIG. 11, the metal electrode M2 is coupled to the drain of the selection transistor TR1 of the cell unit NU by a tungsten contact CT resistor.

The virtual electrode VPRE is configured between the even bias transistor YSEL_e and the odd bias transistor YSEL_o. As shown in FIG. 6, two odd bias transistors YSEL_o are configured adjacently, and two even bias transistors YSEL_e are configured separately. The gate electrodes of the even bias transistors YSEL_e and the odd bias transistors YSEL_o are formed by the polysilicon layer formed on the gate oxide films Gox of the active regions. The polysilicon layer poly1 is orthogonal to the active regions and expends in the row direction. The polysilicon layer Poly and the floating gate which forms the memory cell of the cell unit NU can be formed at the same time.

As shown in FIG. 9 and FIG. 10, the even bit lines GBL0 and GBL2 are connected to the N+ diffusion regions (source) of the even bias transistors YSEL_e by the tungsten contact CT resistors. The odd bit lines GBL1 and GBL3 are connected to the N+ diffusion regions (source) of the odd bias transistors YSEL_o. Therefore, a plurality of transistors YSEL_e and YSEL_o which are connected in parallel are formed among the virtual electrode VPRE, the even bit lines and the odd bit lines.

FIG. 11 shows a cross section of the cell unit NU. The gate electrodes SGD and SGS of the selection transistors TR1 and TR2 are formed by stacking two polysilicon layers together. Also, memory cells MC0~MC31 are formed by the floating gate formed on the first polysilicon layer Poly1 of the gate oxide film Gox, a dielectric layer, and the control gate formed on the second polysilicon layer Poly2 of the dielectric layer. For example, the dielectric layer is an ONO structure formed by configuring a silicon nitride layer between the silicon oxide films, and the second polysilicon layer Poly2 forms the word line. The gate electrodes which form the selection transistors TR1 and TR2 electrically couple the first polysilicon layer Poly1 and the second polysilicon layer Poly2 and are formed from the first polysilicon layer Poly1.

There is a condition when the even bit line is the selected bit line and the odd bit line is the non-selected bit line. When reading data, the bit line selection transistor BLS and the even selection transistor SEL_e are ON and the even bias transistors YSEL_e are OFF, and the selected bit line is coupled to the sensor circuit. At this time, the odd selection transistor SEL_o is OFF and the odd bias transistors YSEL_o are ON, and the shielding potential is applied to the non-selected bit line according to the virtual electrode VPRE.

When programming data, the bit line selection transistor BLS, the even selection transistor SEL_e, the odd selection transistor SEL_o, and the even bias transistors YSEL_e are OFF and the odd bias transistors YSEL_o are ON. The inhibit voltage is applied to the non-selected bit line according to the virtual electrode VPRE, and the channel of the memory cell of the cell unit of the non-selected bit line is pre-charged with the forbidden written voltage. Then, the bit line selection transistor BLS and the even selection transistor SEL_e are ON and the selected bit line is coupled to the sensor circuit. A voltage corresponding to the written data "0" or "1" is applied to the selected bit line. Further, the odd bias transistors YSEL_o and the selection transistors TR1 and TR2 are OFF. Because the non-selected bit line is floating, charges can not be written to the floating gate by coupling between the control gate and the channel.

When erasing data, the bit line selection transistor BLS, the even selection transistor SEL_e, and the odd selection transistor SEL_o are OFF, and the even bias transistors YSEL_e and the odd bias transistors YSEL_o are ON. The selected bit line and the non-selected bit line are pre-charged to the erasing voltage (20V) according to the virtual electrode VPRE. Then, the gates of the selection transistors TR1 and TR2 are floating, the control gate of the selected memory block is configured with 0V, and the erasing voltage (20V) is applied to the P-well.

The active regions of the second selection part 220 are extensions of the active regions of the cell units NU. The even bias transistors YSEL_e and the odd bias transistors YSEL_o can be formed in the same way as the process of forming the memory transistors. The thickness of the gate oxide films Gox of the even bias transistors YSEL_e and the odd bias transistors YSEL_o which form the second selection part 220 is the same as the thickness of the gate oxide films Gox which form the memory unit. The thickness of the gate oxide films Gox of the even bias transistors YSEL_e and the odd bias transistors YSEL_o which form the second selection part 220 is thinner than the thickness of the gate oxide films Gox of the even selection transistor SEL_e and the odd selection transistor SEL_o of the first selection part 210, and the channel length of the gate oxide films Gox of the even bias transistors YSEL_e and the odd bias transistors YSEL_o which form the second selection part 220 is shorter than the channel length of the gate oxide films Gox of the even selection transistor SEL_e and the odd selection transistor SEL_o of the first selection part 210. Therefore, the layout area of the bit line selection circuit can be decreased so as to reduce the size of the flash memory.

In a preferred embodiment of the invention, the second selection part 220 can be formed in the selected memory block of the memory blocks, or is formed adjacent to the selected memory block. For example, as shown in FIG. 3, the second selection part 220 is formed in the memory block BLK(0) adjacent to the page buffer/sensor circuit 160 of the memory array 100, or is formed adjacent to the memory block BLK(0).

Also, when the value m of the memory block is equal to or greater than 2 (i.e., the number of the memory block is equal to or greater than 3), the second selection part 220 can be formed in the middle or adjacent to the middle of the memory blocks. For example, when m=2, the second selection part is formed in the memory block m=1, or is formed adjacent to the memory block m=1. When m=3, the second selection part is formed in the memory block m=1 or m=2, or is formed adjacent to the memory block m=1 or m=2.

While the invention has been described by way of example and in terms of preferred embodiments, it is to be understood that the invention is not limited thereto. Therefore, the scope of the present invention shall be defined and protected by the following claims and their equivalents.

What is claimed is:

1. A semiconductor memory device, comprising
a memory array, composed of a plurality of cell units, wherein each cell unit is composed of electrically-erasable programmable read-only memory cells connected in series;
a row selection circuit, selecting the memory cells in a row direction of the cell units; and
a bit line selection circuit, selecting a bit line from an even bit line and an odd bit line coupled to the cell units;
wherein the bit line selection circuit comprises:
a first selection part comprising selection transistors for selectively coupling the even bit line or the odd bit line to a sensor circuit; and
a second selection part comprising bias transistors for selectively coupling the even bit line or the odd bit line to a voltage source providing biases, wherein the bias transistors and the memory cells are formed in a common well;
wherein the bias transistors comprise even bias transistors coupled between the even bit line and the voltage source and odd bias transistors coupled between the odd bit line and the voltage source, and the even bias transistors and the odd bias transistors, respectively comprise a plurality of transistors coupled in parallel;
wherein the voltage source comprises a strip extended in a column direction in a well of a semiconductor, gate electrodes of the even bias transistors are configured on one side of the voltage source, the gate electrodes of the odd bias transistors are configured on the other side of the voltage source, the voltage source is electrically coupled to diffusion regions of the even bias transistors and the odd bias transistors, the even bit line and the odd bit line comprise a strip extended in a row direction and orthogonal to the voltage source, the even bit line is coupled to the diffusion regions of the even bias transistors and the odd bit line is coupled to the diffusion regions of the odd bias transistors.

2. The semiconductor memory device as claimed in claim 1, wherein a thickness of gate insulating films of the even bias transistors and the odd bias transistors is the same as a thickness of a gate insulating film of transistors which form the memory cells.

3. The semiconductor memory device as claimed in claim 1, wherein the even bias transistors and the odd bias transistors apply the biases to a non-selected one of the even bit line and the odd bit line.

4. The semiconductor memory device as claimed in claim 3, wherein when a pair of voltage sources are configured, gate electrodes of a pair of even bias transistors are configured between the pair of voltage sources.

5. The semiconductor memory device as claimed in claim 1, wherein when a pair of voltage sources are configured, gate electrodes of a pair of odd bias transistors are configured between the pair of voltage sources.

6. The semiconductor memory device as claimed in claim 1, wherein the second selection part is formed in a memory block of the memory array or formed adjacent to the memory block, and the memory block is composed of a plurality of cell units configured in a column direction.

7. The semiconductor memory device as claimed in claim 1, wherein when a plurality of memory blocks are formed in the memory array, the second selection part is formed in the memory blocks or adjacent to the memory blocks.

8. The semiconductor memory device as claimed in claim 1, wherein a thickness of gate oxide films of the even bias transistors and the odd bias transistors is thinner than a thickness of gate oxide films of the selection transistors.

9. The semiconductor memory device as claimed in claim 1, wherein a gate length of the even bias transistors and the odd bias transistors is shorter than a gate length of the selection transistors.

10. The semiconductor memory device as claimed in claim 1, wherein the voltage source provides the biases according to reading, programming, and erasing.

* * * * *